US008071875B2

(12) United States Patent
Li

(10) Patent No.: US 8,071,875 B2
(45) Date of Patent: Dec. 6, 2011

(54) MANUFACTURE OF THIN SOLAR CELLS BASED ON INK PRINTING TECHNOLOGY

(75) Inventor: Xiao-Chang Charles Li, Yardley, PA (US)

(73) Assignee: Xiao-Chang Charles Li, Yardley, PA (US)

( * ) Notice: Subject to any disclaimer, the term of this patent is extended or adjusted under 35 U.S.C. 154(b) by 60 days.

(21) Appl. No.: 12/584,941

(22) Filed: Sep. 15, 2009

(65) Prior Publication Data

US 2011/0065228 A1  Mar. 17, 2011

(51) Int. Cl.
*H01L 31/00* (2006.01)
(52) U.S. Cl. ....................................................... 136/264
(58) Field of Classification Search ........................ None
See application file for complete search history.

(56) References Cited

U.S. PATENT DOCUMENTS

| 7,160,949 B2 * | 1/2007 | Ota et al. ................ 525/242 |
| 7,663,057 B2 * | 2/2010 | Yu et al. ................. 136/264 |
| 7,700,464 B2 * | 4/2010 | Robinson et al. ........ 438/502 |
| 2010/0160503 A1 * | 6/2010 | Nakagawa et al. ...... 524/105 |

* cited by examiner

*Primary Examiner* — Walter L Lindsay, Jr.
*Assistant Examiner* — Andre' C Stevenson

(57) ABSTRACT

Semiconductor ink is disclosed for use in printing thin film solar cell absorber layer. The semiconductor ink is particularly useful in fabricating multi junction tandem solar cell wherein a high bandgap absorber layer as the top cell and a lower band gap absorber layer as the bottom cell. The ink contains ingredients of IB-IIIA-VIA compound with micron-sized semiconductor as the main building "bricks" and nano-sized semiconductor as the binder to fulfill the formation of smooth semiconductive film with micron-sized crystal grain size. Thus formed ink can be used in direct printing for the fabrication of low cost high performance solar cells.

18 Claims, 4 Drawing Sheets

X-ray diffraction spectroscopy of $CuInSe_2$ nanocrystal

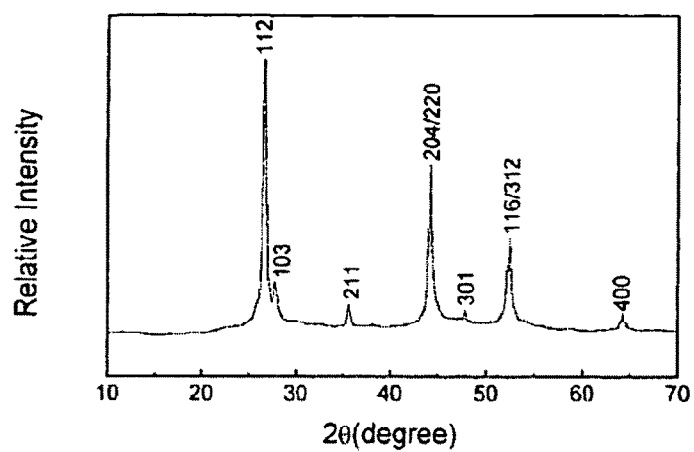
Figure 4: X-ray diffraction spectroscopy of CuInSe$_2$ nanocrystal

MANUFACTURE OF THIN SOLAR CELLS BASED ON INK PRINTING TECHNOLOGY

BACKGROUND OF THE INVENTION

1. Field of the Invention

The present invention relates generally to semiconductive ink compositions, and more particularly, to compositions and methods for printing thin films of IB-IIIA-VIA compound semiconductive material useful in manufacturing thin film solar cells, and particularly monolithically linked or mechanically stacked tandem solar cells with improved efficiency and lowered cost.

2. Description of the Related Art

Copper indium diselenide and its derivatives of gallium and sulfur substituted compounds can be generalized as $CuIn_xGa_{1-x}Se_2S_{2-y}$ (for $0 \leq x \leq 1$, $0 \leq y \leq 2$), and can often be called CIS, CIGSe or CIGSeS. They are IB-IIIA-VIA semiconductor material and are widely used in thin film solar cells, due to their favorable electrical and optical properties, stability, and energy conversion efficiency. The chalcopyrite material is a tetrahedrally-bonded semiconductor, with a bandgap varying continuously with x from about 1.0 eV for copper indium diselenide to about 1.7 eV for copper gallium diselenide, and with a bandgap varying continuously with y from about 1.45 eV for copper indium disulfide $CuInS_2$ to about 2.38 eV for copper gallium disulfide $CuGaS_2$. Since Wagner made the first single crystal $CuInSe_2$ solar cell with 12% efficiency in 1973, much progress has been achieved. So far, the highest solar cell efficiency with the most reliable yield was shown by physical vapor evaporation (PVE) process (with the highest cell energy conversion efficiency of 19.9% (See Ingrid Repins, Miguel A. Contreras, Brian Egaas, Clay DeHart, John Scharf, Craig L. Perkins, Bobby To, Rommel Noufi, 19.9%-efficient ZnO/CdS/CuInGaSe2 solar cell with 81.2% fill factor, Progress in Photovoltaics: Research and Applications, 16, 235 (2008)). However, PVE process is difficult for large area commercial scale PV production due to its point-evaporation nature, and due to the difficulty for uniform composition control. To date, the CIS modules produced are still too expensive to compete with polycrystalline Si based solar modules.

To overcome these hurdles and to achieve a better control of the Cu/(In+Ga) ratio throughout the film, attempts have been made to fix this ratio in a material before the deposition process, and then transfer this fixed composition into the thin film formed using the material. One initial attempt was a screen printing technique that use a paste of milled fine powder of Cu, In and Se in the compositional ratio of 1:1:2 to form a preliminary Cu—In—Se film on a borosilicate glass substrate, followed heating to 700° C. in a nitrogen atmosphere to form a semiconductor compound film of $CuInSe_2$ (T. Arita et al, 20$^{th}$ IEEE PV Specialists conference, 1988, page 1650). Due to the non-uniformity of composition caused by the large metal particle size (up to 2 µm), and the high sintering temperature, which causes indium loss and deforms the soda-lime glass substrate, PV performance was reported to be low, with efficiencies of only about 1%. Also, $In(OH)_3$ or $In_2O_3$ may be formed in the sintered films, as indium powder easily oxidizes at high temperatures in the presence of trace amounts of oxygen.

Another attempt was to prepare chalcogenide nanoparticles by reacting iodides of copper and indium with sodium selenide in an organic solvent bath system such as a mixture of pyridine and methanol, as described in Schultz et al., U.S. Pat. No. 6,126,740. Nanoparticles of $CuInGaSe_2$ in the range of 10-30 nm can be obtained, and their suspension in mixture solvent of pyridine/methanol was sprayed directly onto a molybdenum coated soda-lime glass substrate heated to 144° C. With this technology, a film with fixed ratios of the four elements is readily achieved. However, the CIGS nanoparticles are largely amorphous and the formed film is not desirable for high performance photovoltaic cell. The amorphous condition of the particles may be due to the fast reaction between the iodides and sodium selenide in the pyridine-methanol medium. Besides, the large quantity of sodium iodide byproduct in the film may interfere the formation of crystalline particles.

Recently, Kapur et al. disclosed an oxide-based method of making IB-IIIA-VIA semiconductor compounds (U.S. Pat. No. 6,127,202) in which an ink of oxide-containing particles including Group IB and IIIA elements is formed by pyrolyzing metal nitrates or sulfates of IB and IIIA elements (such as copper and indium) into fine oxide particles. A non-vacuum solution coating method can produce a thin film of $Cu_2In_2O_5$ from these particles, and the film can be transformed to copper indium diselenide (CIS) by treatment in hydrogen, hydrogen selenide, or both at an elevated temperature (425-550° C.). Similarly, $Cu_2In_{2-x}Ga_xO_5$ can be formed and transformed into a $CuIn(Ga)Se_2$ film as disclosed by Eberspacher et al (U.S. Pat. No. 6,268,014). Both techniques utilize the non-volatility of the oxides of IB and IIIA metals, and chemically reduce the oxides while adding selenium to form an IB-IIIA-VIA thin film. Although precise control of the IB/IIIA elemental ratio is readily achieved by this method, the extra reduction and "selenization" process of the oxides are both complicated and costy, which limits the benefit of this non-vacuum process over co-evaporation process. Besides, the difficulty to remove completely the trace oxide of gallium and indium also limits the performance of thus formed solar cells. (X. Charles Li et al, Proc. of SPIE Vol. 7047, 12(2008), Brian Sater et al, U.S. Pat. No. 7,306,823).

To overcome the non-uniformity and the complex reduction/selenization process associated with IB-IIIA oxides, a most recent disclosure utilizes non-oxide nanoparticles of IB-IIIA-VIA that are coated with one or more layers of indium metal (Brian M. Sager, et al, U.S. Pat. No. 7,306,823). Dense precursor films of IB-IIIA-VIA are expected to form upon heating the coated nanoparticles. With this precursor process, the second selenization process is still necessary to drive the metals and the chalcogen to react and form semiconductive chalcopyrite. Besides, due to the different density with various metals of Cu, In, and various compounds, the liquid suspension or the ink is not well formulated suitable for high throughput printing purpose.

With an aim to directly deposit CIGS thin films, nanoparticle CISe solutions have been recently used to form solar cells (Qijie Guo et al, NanoLetters, 8(9), 2982(2008)). This direct printing process has the true nature of high throughput low cost potential. However, the thin film solar cell fabricated by these printing processes still have sacrificed performance compared with their counterparts fabricated by metal oxides inks or fabricated by reactive co-evaporation, largely due to the ink materials used not being formulated or designed for printing applications for solar cells. High efficient CIGS solar cell not only requires a precision control of chemical composition, but also requires large crystal grain size (>1 µm) thin film with excellent composition uniformity; this large crystal grain size requirement contradicts to the formation of nanocrystal CIGS ink wherein smaller size favors more soluble and more stable nanocrystal CIGS ink. It will be appreciated that there is a need in the art for the preparation and formulation of CIGS inks designed for direct printing of CIGS based solar cells.

DISCLOSURE OF INVENTION

Traditionally, ink is used for writing, painting, and coloring on paper or textile. Commercial inks are designed for these purposes with various pigments of a suitable particle size, and the liquid ink with a suitable viscosity and drying properties. With the advent of electronic organic polymers, electronic devices like transistors [Z. Bao, et, Chem. Mater., 1997, 9, 1299], and light emitting diodes [J. Hharathan, Y. Yang, Appl. Phys. Lett., 1998, 72, 2660, X. Charles Li, U.S. Pat. No. 6,372,154] can be made by printing technology. Many varieties of conductive nanoparticle metal inks are also being used for the electronic industry. The electrical properties of these conductive inks vary widely with the metal particle size, chemical composition and the morphology of the formed films. A whole new industry called printed electronics has reached to the scale of 3 $billions in the present market.

The present invention is directed to semiconductor ink for printing of thin film solar cells. The semiconductor ink includes a semiconductor with micro-sized particles selected from IB-IIIA-VIA compound, a semiconductor with nano-sized particles selected from IB-IIIA-VI compound, an ink stabilizer solvent, and an inert solvent vehicle. The micro-sized semiconductor has an average particle size in the range of 0.4-4 µm, preferably between 0.5-2 µm. The micron-sized semiconductor plays a key role to form semiconductor bulk thin film building crystalline "bricks" with optimal morphology. The nano-sized semiconductor has an average particle size of 2-350 nm, preferably between 5-250 nm. The nano-sized semiconductor plays a key role to bind the micro-sized semiconductor "bricks" so as to directly form a semiconductor thin film with large crystal grain size to meet with the requirement of high performance solar cell. The weight ratio of micron-sized semiconductor to nano-sized semiconductor can be varied from 15 to 0.1, and preferably within the range of 10 to 0.5.

The semiconductor is a compound selected from IB-IIIA-VIA, and preferably selected from $CuIn_xGa_{1-x}Se_yS_{2-y}$ wherein $x=0-1$, $y=0-2$. The micron-sized semiconductor can be the same or different from the nano-sized semiconductor depending on the solar cell device design. The ink stabilizer solvent is a liquid solvent containing heteroatom N, O, P, S with a boiling point between 50-350° C. The lone pair electrons on the heteroatom play the role to co-ordinate with particles of CIGS and thus stabilize the particles in the ink and prevent coagulation of particles. The functional stabilizer include, but not restrict to, a liquid selected from organic amine, organic diamine, organic amide, organic imide, organic pyrrole, organic pyrolidone, organic phosphine, organic phosphine oxide, aliphatic alcohol, aromatic alcohol, polyethylene oxide, acetate, organic carboxylic acid.

To formulate the semiconductive ink suitable for printing thin film CIGS used for solar cell, a plurality of liquid vehicle is used in the ink. The liquid vehicle is one or the mixture of more than one solvents with a boiling temperature of 50-350° C., and can be selected from aqueous water, or a non-aqueous hydrocarbon containing carbons up to 50, halogenated hydrocarbon with carbons up to 50, halogenated aromatic hydrocarbons with carbons up to 50, halogenated heteroaromtic hydrocarbons with carbons up to 50.

The semiconductive ink as disclosed in this invention has a suitable range of viscosity up to 90,000 cp depending on printing process. When used with stamping, screen printing or rod-printing applications, the ink can have a very high viscosity, up to 90,000 cp, preferably up to 70,000 cp, and more preferably between 500 and 10,000 cp. But when used with ink-jet printing, the semiconductor viscosity is preferably in the range from about 3 to 100 cp, and more preferably from about 3 to 15 cp. The semiconductor ink contains solid ingredients from 10 wt. % to 95 wt. % (weight), and preferably from 25 wt. % to 75 wt. % (weight).

For controlling the composition and therefore the solar cell's performance, a chalcogen element can optionally be added. The chalcogen element is sulfur, selenium or tellurium. The benefit of the addition of chalcogen in the ink is to compensate the loss of chalcogen of the CIGS nanoink coated film during drying or during annealing process. Not only for the purpose of perfection of the crystalline grain size of the semiconductor, can the chalcogen also alter the band gap of the final film. For instance, in a $CuInSe_2$ film formed by printing of an ink with the ingredient of $CuInSe_2$, a small amount of x sulfur in the liquid ink formulation can lead to the formation of $CuInSe_{2-x}S_x$ upon annealing of the printed film under argon atmosphere. Thus formed sulfurized $CuInSe_{2-x}S_x$ absorber can increase the open circuit voltage of the solar cell. The amount of addition of the chalcogen element is within the range of $x=0-1$.

It is within the scope of this disclosure that an optional thickening polymer is added into the semiconductive ink. The polymer thickening agent can stabilize the nanoparticle ink, and the polymer thickening agent is a thermal decomposable polymer (TDP) that will subject a complete removal upon heating not higher than 550° C. Examples of the thickening polymer can be preferably selected from poly(acrylate amide), poly(acrylate acid), poly(vinyl acetate).

The present invention also includes a method of fabrication single junction solar cells and advanced multi junction tandem solar cells with the use of the present disclosed ink. Such single junction solar cell will include a first electrode surface. The semiconductor ink is printed onto the first electrode surface to directly form p-type semiconductor thin film with large crystal grains suitable for high performance solar cell. After forming a p-n heterojunction with an n-type semiconductor, a second electrode is deposited to form the single p-n heterojunction solar cell. In a multi-junction monolithic solar cell, a p-type semiconductive thin film $CuIn_xGa_{1-x}Se_yS_{2-y}$ having a bandgap of about 1.0-1.2 eV is printed on a first electrode, and then form the bottom solar cell upon the deposition of a n-type semiconductor, and a transparent conducting oxide (TCO). Another p-type semiconductor thin film $CuIn_xGa_{1-x}Se_yS_{2-y}$ having a bandgap of about 1.6-2.4 eV is printed on to TCO of the bottom solar cell. After forming the upper p-n heterojunction with an n-type semiconductor, another second electrode is deposited to form the two junction tandem solar cell. In this monolithic two junction tandem solar cell, the absorber layer in the top cell has a higher band gap (1.6-2.4 eV), it can hence effectively absorb shorter wavelength sunlight, such as from 350 nm to 600 nm; and the absorber layer in the bottom cell has a lower bandgap (1.0 eV), it can hence effectively absorb longer wavelength sunlight, such as from 500 nm to 1150 nm.

BRIEF DESCRIPTION OF THE DRAWINGS

FIG. 4 illustrates the X-ray diffraction spectroscopy of $CuInSe_2$ nanocrystal.

DETAILED DESCRIPTION OF THE PREFERRED EMBODIMENTS

Figure 1:
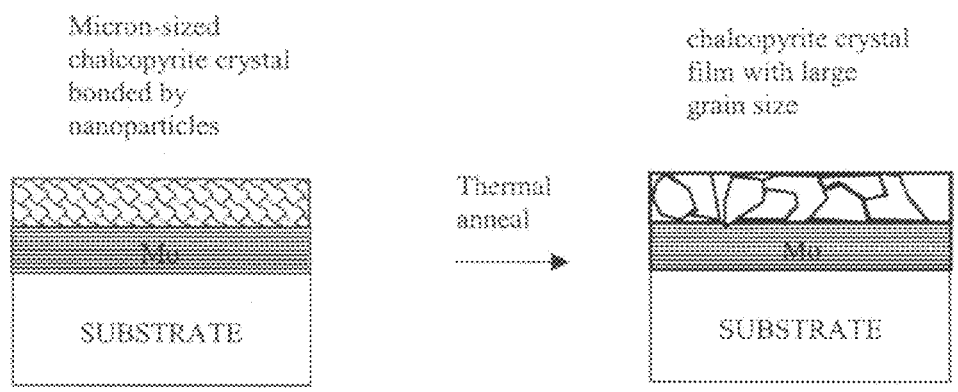
FIG. 1 illustrates the formation of micron-sized semiconductor particles as the polycrystalline "bricks" bonded by nano-sized semiconductor particles. Upon drying and annealing, semiconductor thin film with large crystalline grains is achieved.

The present invention relates generally to semiconductive ink compositions, and more particularly, to compositions and methods for printing thin films of compound semiconductive material useful in manufacturing thin film solar cells, and particularly monolithically linked or mechanically stacked tandem solar cells with improved efficiency and lowered cost.

The present invention is directed to a semiconductive compound ink for direct printing of semiconductive films used for solar cells. Here direct printing of semiconductive films means the use of ingredients of semiconductive compound of IB-IIIA-VIA. Examples of these semiconductive compounds can be generalized as the formula, $CuIn_xGa_{1-x}Se_yS_{2-y}$, such as $CuInS_2$, $CuInSe_2$, $CuInSSe$, $CuGaS_2$, $CuGaSe_2$, $CuGaSSe$, etc. Differing from the use of nanoparticle oxides of Cu, In, Ga, described in the prior art, which requires the process of hydrogen reduction process and which is hard to remove trace of oxide, the direct printing of semiconductive films of chalcopyrite materials offers the benefit of direct use of the material in a solar cell as the active absorber layer without the need to reduce the metal oxide. The printing here include screen-printing, dipping, spin-coating, rod-coating, brushing, spraying, ink-jet printing or other similar printing technology. Differing from the simple use of nanoparticle $CuInSe_2$ suspended in a solvent, the semiconductive compound ink is formulated to meet with the special application of solar cell fabricated by ink printing process. It basically includes a plurality of nanocrystal semiconductor compound from IIB-IIIA-VIA as a "binder", a plurality of micron-sized crystalline semiconductor compound from IIB-IIIA-VIA as the crystalline building "bricks", a liquid vehicle, and a functional liquid stabilizer, and it can be generalized as following:

CIGS ink=
1. Micro-sized particulates of semiconductor compound IB-IIIA-VIA+
2. Nano-sized particulates of semiconductor compound IB-IIIA-VIA+
3. Stabilizing solvent+
4. Liquid vehicle.

According to the disclosure in this invention and with the use of the micron-sized crystal as the building bricks, polycrystalline semiconductor thin film with large grain size (micron-sized) can be achieved more easily, faster, and at lower annealing temperature. It is necessary to use the nano-sized semiconductor as the "binder" to guarantee the preparation of smooth film of IB-IIIA-VIA semiconductor without peeling problem. Also, it is necessary to use an ink stabilizer solvent to adjust the viscosity and to stabilize the store stability of the ink. It is further necessary to use plurality amount of liquid vehicle to meet the need of wetting substrate surface and to control the formation of smooth film without cracks and free from pin-holes. The semiconductive ink as disclosed in this invention has a suitable range of viscosity up to 90,000 cp depending on printing process. When used with stamping, screen printing or rod-printing applications, the ink can have a very high viscosity, up to 90,000 cp, preferably up to 70,000 cp, and more preferably between 500 and 10,000 cp. But when used with ink-jet printing, the semiconductor viscosity is preferably in the range from about 3 to 100 cp, and more preferably from about 3 to 15 cp.

The semiconductive compound is selected from IB-IIIA-VIA and preferably has a general formula of $CuIn_xGa_{1-x}Se_yS_{2-y}$. They have a band gap within the rage of 1.0 eV to 2.4 eV depending on the composition, and they are useful as the active sun light absorber layer in a solar cell. Examples of the semiconductive compounds are, $CuInSe_2$ (band gap of 1.0 eV), $CuInS_2$ (band gap of 1.45 eV), $CuGaSe_2$ (band gap of 1.67 eV), $CuGaS_2$ (2.38 eV), $CuIn_{0.7}Ga_{0.3}Se_2$ (1.18 eV), $CuIn_{0.7}Ga_{0.3}S_2$ (1.75 eV), $CuInSSe$ (1.4 eV), $CuIn_{0.7}Ga_{0.3}SSe$ (band gap of 1.45 eV). The chalcopyrite material is a tetrahedrally-bonded semiconductor, with a bandgap varying continuously with x (x=0-1) from about 1.0 eV for copper indium diselenide to about 1.7 eV for copper gallium diselenide, and with a bandgap varying continuously with y (y=0-2) from about 1.45 eV for copper indium disulfide $CuInS_2$ to about 2.38 eV for copper gallium disulfide $CuGaS_2$. Many other variation of composition and therefore band gap can be tuned by changing values of x or y in order to prepare semiconductive thin film with different band gap to absorb different range of wavelength light.

As used herein, the ink suitable for printing thin film used for solar cell is composed of plurality of micron-sized particulates of one or more semiconductor compounds with the size of 0.4-4 μm. Such micron-sized semiconductor chalcopyrite material (with the general formula of $CuIn_xGa_{1-x}Se_yS_{2-y}$) can be prepared by physical grinding, or desirably by ball milling of a pure crystal compound. It is apparent that size herein means the average size of a certain distribution. The particle size low end limit for ball milling is normally about 0.5 μm; further smaller size is usually hardly achievable. Since the optimal thin film CIGS solar cell is between 1-3 μm, it is therefore desirable to use an average particulate size of 0.4-2 um. Generally, one compound semiconductor of IB-IIIA-VIA will be enough to meet the solar cell requirement. In some cases, two or more mixed compounds with the similar size and size distribution will be necessary for the purpose to adjust band gap and therefore open circuit voltage of the solar cell. For instance, the mixed use of $CuInS_2$ and $CuInSe_2$ for a nano-sized IB-IIIA-VIA compound, or the mixed use of $CuInS_2$ and $CuInSe_2$ for a micro-sized IB-IIIA-VIA compound, and even the mixed use of $CuInSe_2$ as the micro-sized IB-IIIA-VIA compound and $CuInS_2$ as the nano-sized IB-IIIA-VIA compound.

Figure 2:
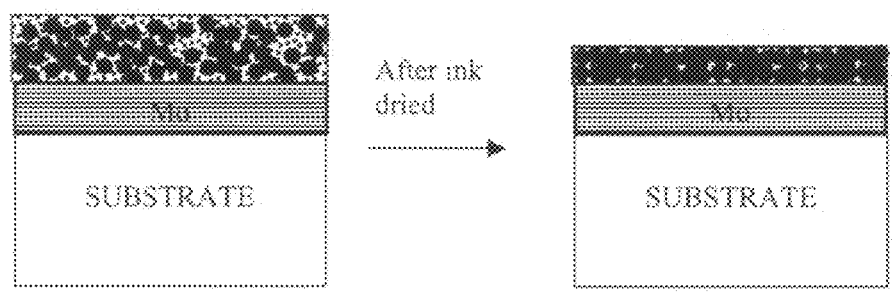
FIG. 2 illustrates the process of nano-ink printing and drying (tiny dark dots are nano-sized semiconductor, and bigger dark dots are micron-sized semiconductor)

As used herein, the ink suitable for printing thin film used for solar cell is additionally composed of plurality of nano-sized particulates of one or more semiconductor compounds with the size of 2-350 nm. Such nano-sized semiconductor chalcopyrite material (with the general formula of $CuIn_xGa_{1-x}Se_yS_{2-y}$) can be prepared by pyrolysis in the vapor phase, or in a chemical reaction in a liquid media, or other physical and chemical preparation methods. It is within the scope of this invention that the nanoparticles may have various morphological shapes, such as nanospheres, nanorods, nanoboxes, or nano sized core-shells structure. It is apparent that the size here means the average size of a certain distribution. Nanoparitcles have a very high ratio of surface area to volume ratio, and this character renders nanoparticle two important features for the ink formulation. One feature is that the nanoparticle of the chalcpyrite semiconductor is stable enough in a suspension or even "dissolved" in a solvent, due to that the strong interaction of the nanoparticle surface with the solvent is strong enough to overcome the gravity of the material. Another feature is that the nanoparticle of the chalcopyrite semiconductor provides tremendous driving force for diffusion especially at elevated temperature. It is this diffusion feature that the formulated semiconductor ink can be used to form smooth film upon drying, due to that the nanoparticle plays a role as filler for micron voids and as "binder" to bind the micron-sized chalcopyrite semiconductor particulates. FIG. 2 shows the printed film and the film formed upon the drying of solvent. The nanoparticles not only filled the voids among the micro-sized CIGS particles, but also bind the micro-sized particles ("bricks") into smooth film.

The addition of ink stabilizer liquid or liquid mixture can be one or more than one liquid containing heteroatom, such as O, N, S, and P with a boiling point between 50-350° C. Lower than 50° C. boiling point solvent is not that useful as it can be evaporated too fast to control the drying process. Higher boiling point than 350° C. is also not suitable as trace of them could be too difficult to dry. The lone pair electrons on the heteroatom play the role to co-ordinate with particles of CIGS and thus stabilize the particles in the ink and prevent coagulation of particles. The functional stabilizer include, but not restrict to, wherein the plurality of solvents are organic amine, organic diamine, organic amide, organic imide, organic pyrrole, organic pyrolidone, organic phosphine, organic phosphine oxide, aliphatic alcohol, aromatic alcohol, polyethylene oxide, acetate, organic carboxylic acid.

To formulate the semiconductive ink suitable for printing thin film CIGS used for solar cell, a plurality of liquid vehicle is used in the ink. The liquid vehicle is one or the mixture of more than one solvents with a boiling temperature of 50-350° C., and can be selected from a aqueous water, or a non aqueous hydrocarbon, wherein the plurality of solvents are organic amine, organic diamine, organic amide, organic imide, organic pyrrole, organic pyrolidone, organic phosphine, organic phosphine oxide, aliphatic alcohol, aromatic alcohol, polyethylene oxide, acetate, organic carboxylic acid, wherein the plurality of vehicle liquid is mainly organic hydrocarbon containing carbons up to 50, halogenated hydrocarbon with carbons up to 50, halogenated aromatic hydrocarbons with carbons up to 50, halogenated heteroaromtic hydrocarbons with carbons up to 50.

It is apparent that the semiconductive ink contains both nano-sized and micron-sized particulates. The optimal combination of the micron-sized and nano-sized particles of the semiconductor not only enables the great cost-cut in comparison to the sole use of nano-size particle semiconductors, but also enables dense film formation with large crystal grain size formation to promote the solar cell performance. The sole use of micro-sized chalcopyrite semiconductive compound in an ink can only lead to the formation of loose particle film which has too much porosity to form good solar cell quality films, and has no mechanical strength so that it can be peeled off by simple scotch tap testing. Solar cells made by this way, as shown in the literature and as proven by our testing in the Example 1, have very low energy conversion efficiency. The sole use of nano-sized chalcopyrite semiconductive compound in an ink can lead to dense film upon drying due to dense packing of the nanoparticles. However, the formed film has much smaller crystalline grain size and lead to lowered solar cell efficiency. Like new crystal phases, new nano-sized materials are difficult to make in the laboratory and even more difficult to manufacture in mass quantity. With the use of the present invention ink, dense chalcopyrite semiconductive film with large grain size crystals can be formed in a more economical way due to the need of much less quantity of nano-sized compound, and in a faster way due to the crystal growth "seeding" effect from the use of micron-sized semiconductor compound, or the "diffusion" effect from the use of nano-sized semiconductor compound. Surprisingly, the combined use of micron-sized chalcopyrite particles and nano-sized chalcopyrite particles can lead to the manufacture of solar cells with much improved efficiency than the sole use of nano-crystal CIGS inks. The weight ratio of micron-sized semiconductor to nano-sized semiconductor can be varied from 15 to 0.1, and preferably within the range of 10 to 0.5.

It is within the scope of this disclosure that an optional thickening polymer is added into the semiconductive ink. The polymer thickening agent can stabilize the nanoparticle ink, and the polymer thickening agent is a thermally decomposable polymer (TDP) that will subject a complete removal upon heating not higher than 550° C. Examples of the thickening polymer can be preferably selected from poly(acrylate amide), poly(acrylate acid), poly(vinyl acetate).

By a simple printing of the IB-IIIA-VIA semiconductor ink and drying, smooth film with good micron-sized crystal grains can be formed for the application of solar cell. The printing here includes screen-printing, dipping, spin-coating, rod-coating, brushing, spraying, and ink-jet printing technology. It is within the scope of this invention that to get a good quality film of IB-IIIA-VIA, the film is dried at room temperature with a stream of nitrogen or air, or at elevated temperature (<200° C.) under vacuum or under inert atmosphere without annealing. Annealing process is a post treatment of dried film of IB-IIIA-VIA by heating to an elevated temperature (200-550° C.) for a certain time. It is also within the scope of this invention that an annealing process is applied to optimize the semiconductor film and to optimize the solar cell's performance. The annealing process of the printed semiconductor film can be carried out under vacuum, under an inert atmosphere, or desirably under the existence of a chalcogen source. Here a chalcogen source can be a partial pressure of sulfur, selenium, hydrogen sulfide, hydrogen selenide, organic sulfide, organic selenide compound, etc, or a mixture use of more than one chalcogen sources.

It is further within the scope of this disclosure that a certain amount of chalcogen elements may be optionally added into the ink. The chalcogen element is sulfur, selenium or tellurium. The benefit of the addition of chalcogen in the ink is to compensate the loss of chalcogen of the CIGS nanoink coated film during drying or during annealing process. Not only for the purpose of perfection of the crystalline grain size of the semiconductor, can the addition of chalcogen also alter the band gap of the final film. For instance, in a $CuInSe_2$ film formed by printing of an ink with the ingredient of $CuInSe_2$, a small amount of x sulfur in the liquid ink formulation can lead to the formation of $CuInSe_{2-x}S_x$ upon annealing of the printed film under argon atmosphere. Thus formed sulfurized $CuInSe_{2-x}S_x$ absorber can increase the open circuit voltage of the solar cell. The amount of addition of the chalcogen elements is within the range of x=0-1.

With the use of the disclosed ink printing, manufacturing a solar cell can be accomplished by the steps of obtaining a first electrode surface; printing a nanoparticle chalcopyrite ink onto the first electrode surface; forming a p-n heterojunction with a n-type semiconductor; and coupling a second electrode to the p-n heterojunction. For those with ordinary skills, it is familiar to use a soda lime glass as the substrate and a conductive metal molybdenum is then sputtered on the glass to form the first electrode molybdenum. Other substrates, such as a metal foil or a polymer film, can also be a substrate candidates. Being chemically inert and thermally compatible to glass substrate, molybdenum is widely used as the mirror electrode for CIS solar cell, though other conducting materials, such as chromium, nickel, ZnO, $SnO_2$, indium tin oxide (ITO), can also be the candidate for the first electrode. To form a p-n junction solar cell, an n-type semiconductor, such as CdS, ZnS, In$_2$S$_3$, ZnO, CdZnS$_2$, or a mixture of them, can be deposited on top of the IB-IIIA-VIA semiconductor. To those with ordinary skills, it is familiar to use a chemical bath deposition method (CBD) to form CdS or ZnS with the thickness of about 40-80 nm to accomplish the p-n single junction solar cell. Other fabrication methods, such as sol-gel coating, nano-particle coating, thermal vacuum evaporation, and sputtering, can also be employed. For a more reliable solar cell, a thin layer of insulator ZnO (i-ZnO) is coated on top of the n-type layer, before depositing a transparent conductive ZnO: Al (3% Al at. %) as the second electrode. It is apparent that light irradiates through the second electrode TCO, and the absorption of the light on the thin film IB-IIIA-VIA results the formation of light-induced excitons. The separation of the excitons through the electrical field across the p-n junction leads to the generation of electrons and holes respectively on each electrode. The electrical energy collected as electrons and holes from both the electrodes depends on the structure of solar cell, and most importantly on the perfection of the absorber layer.

It is within the scope of this invention that a chalcopyrite semiconductor compound is used as the absorber layer, and it is selected from IB-IIIA-VIA, and preferably has a general formula of CuIn$_x$Ga$_{1-x}$Se$_y$S$_{2-y}$, wherein x=0-1, y=0-2; One example of it is CuGaSe$_2$ (when x=0 and y=2) which is a direct semiconductor with a band gap of 1.67 eV. Although the single crystal CuGaSe$_2$ has been prepared by molecular epitaxy method, its practical use as solar cells has been limited due to the difficulty for scaled device fabrication. Reactive Co-evaporation of Cu, Ga and Se can lead to large crystal grain size thin film CuGaSe$_2$, and good efficiency CuGaSe$_2$ solar cell has been reported. Differing from the narrow band gap CuInSe$_2$ semiconductors (bandgap of 1.0 eV) which is suitable for use alone or used at the bottom cell in a tandem solar cell, the wide band gap chalcopyrite CuGaSe$_2$ (1.67 eV) is the ideal semiconductor for the top cell in a tandem double junction solar cell. A tandem solar cell is two solar cells in a stack, where the top cell collects the blue portion of the solar spectrum and the bottom cell collects the rest of the visible spectrum. Since sunlight is made up of different wavelength light raging from ultraviolet, blue, green, red to infrared, a combination of solar cells of different materials will convert sunlight more efficiently than any single cell. However, past attempts to use CuGasSe$_2$ as the monolithic linked tandem top cell have failed due to that the high temperature required (>500° C.) for co-evaporation process for CuGaSe$_2$ thin film formation can damage the bottom cell. With the use of the semiconductor ink printing technology, it is excitingly convenient to fabricate a tandem solar cell using the combination of a lower band gap semiconductor as the bottom cell absorber, and a higher band gap semiconductor as the top cell absorber.

Figure 3:
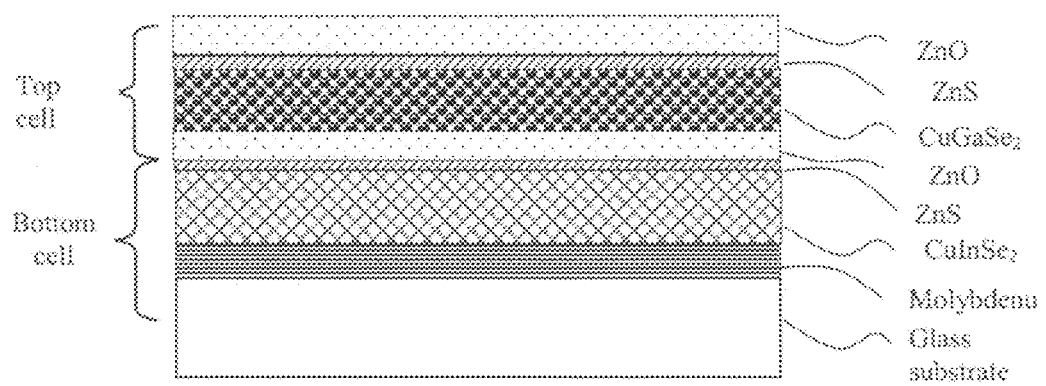
FIG. 3 is a schematic cross-sectional representation of one possible monolithic linked tandem solar cell fabricated by ink printing of a low band gap semiconductor $CuInSe_2$ (1.1 eV) in the bottom cell and a high bandgap semiconductor $CuGaSe_2$ (1.7 eV) in the top cell.

Multi-junction cells are made in one of two basic ways: monolithic or mechanically stacked. Monolithic multijunctions are made by sequentially growing all the necessary layers of materials for two cells and the interconnection between the cells, one layer on top of another. With mechanically stacked multi-junctions, different cells are made separately, stacked on top of one another, and stuck together with transparent adhesive. With the use of the present disclosed ink, thin film with good micron-sized CuGaSe$_2$ can be directly printed even at room temperature on top of the solar cell Glass/Mo/CuInSe$_2$/ZnS/i-ZnO/ZnO-top cell of CuGaSe$_2$. (FIG. 3) In this monolithic two junction tandem solar cell, the absorber layer in the top cell has a higher band gap (1.7 eV), it can hence effectively absorb shorter wavelength sunlight, such as from 350 nm to 600 nm; and the absorber layer in the bottom cell has a lower bandgap (1.0 eV), it can hence effectively absorb longer wavelength sunlight, such as from 500 nm to 1150 nm.

It is within the scope of this invention that a mechanically stacked four terminal two junction solar cell is formed wherein one or both the cells are made by ink printing using the formulation of this disclosure. In a four terminal two junction solar cell, one top cell is consists of a higher band gap material to absorb blue color range light, and another bottom cell is consists of lower band gap material to absorb the rest transmitted longer wavelength light. The two cells are simply glue together by using a polymer thin film laminator, such as ethylene vinyl acetate (EVA). In total, a multi-junction tandem solar cell can achieve higher total conversion efficiency because they can convert more of the energy spectrum of light to electricity. In theory, any number of cells can be used in multi junction devices forming two, three or more junctions solar cell. In practice, two or three junctions are more practically used.

EXAMPLES

The following examples are given to illustrate various embodiments within the scope of the present invention. These are given by way of example only, and it is to be understood that the following examples are not comprehensive or exhaustive of the any types of embodiments of the present invention that can be prepared in accordance with the present invention.

Example 1

A Compound semiconductor CuInSe$_2$ was prepared by reacting equivalent mole of Cu powder, indium shots with two mole equivalent amount of selenium pellets at temperature of 350° C. under a pressured nitrogen atmosphere (50 Psi) for 2 hours. The formed CuInSe$_2$ crystal material was crashed into fine power of about 300 μm, and ball milled into micro-sized fine power with the average particle size of about 0.6 μm suspended in mixture solvent of butyl acetate/anisole (1:1 v/v) with the concentration of 40% (g/mL). Thus formed ink is drop-coated on a molybdenum (0.6 μm) coated soda lime glass with the final black film thickness of 2.0 μm upon drying at 160° C. under vacuum. Dektak surface profile shows the film is not smooth with the variation of 30%. The film is further annealed at argon atmosphere at 300° C. for 2 hours, and the film was peeled off by a scotch tape test. No solar cell device was made as the result of loose film morphology.

Example 2

A direct formation of CuInGaSe$_2$ nanoparticle through a chemical reaction in the mixture solvent of dichlorobenzene and trioctyl phosphine was carried out:

$$Cu(acac)_2 + In(acac)_3 + +2Se \rightarrow CuInSe_2 \qquad (1)$$

The formed nanoparticle CIS was purified through a repeated dissolving and precipitation method in dichlorobenzene and ethanol, and finally stabilized in a capping agent, oleylamine. The ink could be used for screen printing, brushing, dipping, spin-coating, ink-jet printing, or rod-coating to form film of CuInSe$_2$ film. By a simple rod-coating on a Mo coated soda lime glass substrate, and dried under vacuum oven at 150° C. for 3 hours, a smooth film (non-uniformity<5%) was formed without peeling by a Scotch tape. The film showed typical nanocrystalline feature from XRD analysis, as shown in FIG. 4 below. A chalcopyrite phase at 2θ=26.6° oriented along the (112) direction. To form a device quality thin film, the dried film was annealed at elevated temperature 250° C. for 3 hours in order to drive the nanocrystal into polycrystalline film suitable for solar cell application. A standard CIS solar cell was build by deposition of a thin layer of n-type CdS by a chemical bath deposition method, an insulator ZnO by magnetron sputtering and finally a transparent conductive oxide layer of ZnO:Al (3%). The final device of Glass/Mo (0.6 μm)/CIS 2.0 um/CdS (50 nm)/i-ZnO 60 nm/ZnO:Al (0.5 μm) showed photovoltaic effect under the illumination of 1.5 AM standard condition with the irradiance of 1000 W/m$^2$, with the performance of Voc=0.421 V; Jsc=18.8 mA/cm$^2$, Field effect %=40%; Energy conversion efficiency=3.2%.

Example 3

A CIS semiconductor ink was formulated by combining the following ingredients in a solvent vehicle:
CuInSe$_2$ particles as prepared and ball milled to 0.6 μm size: 60 parts by weight
Nanosized CuInSe$_2$ as prepared in Example 2: 30 parts by weight
Oleyl amine: 3.0 parts by weight
Anisole: 60 parts
Butyl acetate: 60 parts By using the above formulated ink, a standard solar cell was made according to the description of Example 2, and the following structure: SLG Glass/Mo (0.6 μm)/CIS 2.0 um/CdS (50 nm)/i-ZnO 60 nm/ZnO:Al (0.5 μm) showed photovoltaic effect under the illumination of 1.5 AM standard condition with the irradiance of 1000 W/m$^2$, with the performance of Voc=0.491 V; Jsc=31.8 mA/cm$^2$, Field effect %=57%; Energy conversion efficiency=9.1%.

Example 4

A CIS semiconductor ink was formulated by combining the following ingredients in a solvent vehicle:
CuInSe$_2$ particles as prepared and ball milled to 0.6 μm size: 60 parts by weight
Nanosized CuInS$_2$ as prepared similar to Example 2: 30 parts by weight
Selenium (dissolved in trioctyl phosphine): 10 parts by weight
Trioctyl phosphine: 45 parts by weight
Oleyl amine: 3.0 parts by weight
Anisole: 50 parts
Butyl acetate: 15 parts By using the above formulated ink, a standard solar cell was made according to the description of Example 2, except the annealing was carried out at 520° C. for 1 hour, and the following structure: SLG Glass/Mo (0.6 μm)/CIS 2.0 um/CdS (50 nm)/i-ZnO 60 nm/ZnO:Al (0.5 μm) showed photovoltaic effect under the illumination of 1.5 AM standard condition with the irradiance of 1000 W/m$^2$, with the performance of Voc=0.585 V; Jsc=32.85 mA/cm$^2$, Field effect=65%; Energy conversion efficiency=13.6%.

Example 5

A CIS semiconductor ink was formulated by combining the following ingredients in a solvent vehicle:
CuGaSe$_2$ particles as prepared and ball milled to 0.6 μm size: 60 parts by weight
Nanosized CuGaSe$_2$ as prepared similar to Example 2: 30 parts by weight
Selenium (dissolved in trioctyl phosphine): 10 parts by weight
Trioctyl phosphine: 45 parts by weight
Oleyl amine: 3.0 parts by weight
Anisole: 50 parts
Butyl acetate: 15 parts By using the above formulated ink, a standard solar cell was made according to the description of Example 4, except the absorber layer is a high band gap CuGaSe$_2$ (1.7 eV), and the following structure: SLG Glass/Mo (0.6 μm)/CuGaSe2 2.0 um/CdS (50 nm)/i-ZnO 60 nm/ZnO:Al (0.5 μm) showed photovoltaic effect under the illumination of 1.5 AM standard condition with the irradiance of 1000 W/m$^2$, with the performance of Voc=0.80 V; Jsc=24.75 mA/cm$^2$, Field effect=55%; Energy conversion efficiency=9.6%.

Example 6

A bottom up tandem monolithic two junction solar cell was made based on the bottom device of CuInSe2 (1.1 eV) as described in Example 4. On top of the ZnO:Al was rod-coated with an ink as described in Example 5 using CuGaSe2 (1.7 eV) as the absorber layer. The thin film was annealed at 300° C. for 2 hours, and a thin layer of n-type ZnS was deposited by a chemical bath deposition method. The final two junction tandem solar cell has a structural of SLG glass/Mo (0.6 um)/CuInSe$_2$ (1.4 um)/CdS (50 nm)/i-ZnO (60 nm)/ZnO:Al (0.5 um)/CuGaSe$_2$ (1.1 um)/ZnS (50 nm)/i-ZnO (60 nm)/ZnO:Al (500 nm), and it showed photovoltaic effect under the illumination of 1.5 AM standard condition with the irradiance of 1000 W/m$^2$, with the performance of Voc=1.35 V; Jsc=25.1 mA/cm$^2$, field effect=63%; energy conversion efficiency=14.5%.

I claim:

1. A semiconductive ink for printing semiconductor photovoltaic cells comprising:
    a plurality of micro-sized particulates of one or more chalcopyrite compounds with the size between 0.4-4 um and having the general formula of CuIn$_x$Ga$_{1-x}$Se$_y$S$_{2-y}$, wherein x=0-1, y=0-2;
    a plurality of nano-sized particulates of one or more chalcopyrite compounds with the size of 2-350 nm and having the general formula of CuIn$_x$Ga$_{1-x}$Se$_y$S$_{2-y}$, wherein x=0-1, y=0-2;
    a plurality of solvents consisting of heteroatom of N, O and P for dissolving and stabilizing nano-sized particulates;
    a polymer thickening agent to stabilize the nanoparticle ink, and the polymer thickening agent is a thermal decomposable polymer (TDP) that will subject a complete removal upon heating not higher than 550° C., and that contains a source of sodium to dope CIGS semiconductor and to enhance the crystalline perfection of chalcopyrite semiconductor
    a plurality of liquid vehicle.

2. A semiconductive ink for printing semiconductor photovoltaic cells according to claim 1, wherein the polymer thickening agent is preferably selected from poly(acrylate amide), poly(acrylate acid), sodium salt of poly(acrylate acid), poly(vinyl acetate), and most preferably sodium salt of poly(acrylate acid) to provide sodium to dope CIGS semiconductor and to enhance the crystalline perfection of chalcopyrite semiconductor.

3. A semiconductive ink for printing semiconductor photovoltaic cells according to claim 1, wherein the micron-sized semiconductor particles are polycrystalline particles formed by ball milling or simple physical grinding and with the size between 0.4-4 um, preferably between 0.5-2 μm.

4. A semiconductive ink for printing semiconductor photovoltaic cells according to claim 1, wherein the nano-sized semiconductor particles are chalcopyrite polycrystalline particles formed by one or a series of chemical reactions, and with the size between 2-350 nm, preferably between 5-250 nm.

5. A semiconductive ink for printing semiconductor photovoltaic cells according to claim 1, wherein the plurality of ink stabilizer solvents are organic amine, organic diamine, organic amide, organic imide, organic pyrrole, organic pyrolidone, organic phosphine, organic phosphine oxide, aliphatic alcohol, aromatic alcohol, polyethylene oxide, acetate, organic carboxylic acid.

6. A semiconductive ink for printing semiconductor photovoltaic cells according to claim 1, wherein the plurality of vehicle liquid is mainly aqueous liquid with the majority of water.

7. A semiconductive ink for printing semiconductor photovoltaic cells according to claim 1, wherein the plurality of vehicle liquid is mainly organic hydrocarbon containing carbons up to 50, halogenated hydrocarbon with carbons up to 50, halogenated aromatic hydrocarbons with carbons up to 50, halogenated heteroaromtic hydrocarbons with carbons up to 50.

8. A semiconductive ink for printing semiconductor photovoltaic cells according to claim 1, wherein the ink contains solid ingredients from 10 wt. % to 95 wt. % (weight), and preferably from 25 wt. % to 65 wt. % (weight).

9. A semiconductive ink for printing semiconductor photovoltaic cells according to claim 1, wherein the ink may optionally contain chalcogen elements of selenium or sulfur.

10. A semiconductive ink for printing semiconductor photovoltaic cells according to claim 1, wherein the weight ratio of micron-sized semiconductor to nano-sized semiconductor can be varied from 15 to 0.1, and preferably within the range of 10 to 0.5.

11. A method for manufacturing a solar cell comprising the steps of:
Obtaining a first electrode surface; printing a nanoparticle chalcopyrite ink onto the first electrode surface wherein the chalcopyrite nanoink comprises:
a plurality of micro-sized particulates of one or more chalcopyrite compounds with the size between 0.4-4 um and having the general formula of $CuIn_xGa_{1-x}Se_yS_{2-y}$ wherein $x=0-1$, $y=0-2$;
a plurality of nano-sized particulates of one or more chalcopyrite compounds with the size of 2-350 nm and having the general formula of $CuIn_xGa_{1-x}Se_yS_{2-y}$ wherein $x=0-1$, $y=0-2$;
a plurality of solvents consisting of heteroatom of N, O, S and P for dissolving and stabilizing nano-sized particulates;
a polymer thickening agent to stabilize the nanoparticle ink, and the polymer thickening aunt is a thermal decomposable polymer (TDP) that will subject a complete removal upon heating not higher than 550° C., and that contains a source of sodium to dope CIGS semiconductor and to enhance the crystalline perfection of chalcopyrite semiconductor
a plurality of liquid vehicle
forming a p-n heterojunction with a n-type semiconductor; and
coupling a second electrode to the p-n heterojunction.

12. A method of fabricating a solar cell in accordance with claim 11 wherein said printing to form the p-type semiconductive layer means ink-jet printing, stamping, spraying, brushing, rod-coating, spin-coating, dipping, drop-coating, or screen printing.

13. A method for manufacturing a tandem two junction monolithic solar cell comprising the steps of:
Forming an upper cell comprising a p-type semiconductive thin film $CuIn_xGa_{1-x}Se_yS_{2-y}$ having a bandgap of about 1.6-2.4 eV by printing method
Forming a lower cell comprising a p-type semiconductive thin film $CuIn_xGa_{1-x}Se_yS_{2-y}$ having a bandgap of about 1.0-1.2 eV by a wet-coating method
Forming a transparent conductive oxide layer to electrically connect the upper cell and lower cell to form monolithic tandem solar cell.

14. A method for manufacturing a tandem two junction monolithic solar cell comprising the steps of:
Forming a lower cell comprising a p-type semiconductive thin film $CuIn_xGa_{1-x}Se_yS_{2-y}$ having a bandgap of about 1.0-1.2 eV by printing method
Forming a top solar cell using a p-I-n structure of a-Si:H thin film solar with the band gap of 1.6-1.8 eV
Forming a transparent conductive oxide layer to electrically connect the upper cell and lower cell to form monolithic tandem solar cell.

15. A method for manufacturing a multi-junction monolithic solar cell according to claim 13 or 14, wherein the transparent conductive metal oxide (TCO) is a thin film of ZnO, Al-doped ZnO, Ga-doped ZnO, Cd-doped ZnO, ZnS, CdS, $In_2O_3$, indium tin oxide, $In_2S_3$.

16. A method for manufacturing a mechanically stacked four terminal solar cell comprising the steps of:
Forming a top cell comprising a p-type semiconductive thin film $CuIn_x Ga_{1-x}Se_yS_{2-y}$ having a bandgap of about 1.6-2.4 eV by printing method according to claim 11
Forming a lower cell comprising a p-type semiconductive thin film $CuIn_xGa_{1-x}Se_yS_{2-y}$ having a bandgap of about 1.0-1.2 eV by printing method according to claim 11
Coupling the top cell and lower cell by using a polymer binder to form a mechanically stacked tandem solar cell with four terminals.

17. A method for manufacturing a mechanically stacked four terminal solar cell according to claim 16, wherein the polymer binder is ethylene vinyl acetate polymer (EVA).

18. A method of fabricating a solar cell in accordance with claim 13, 14, or 16, wherein said wet-coating and printing to form the p-type semiconductive layer means dip coating, ink-jet printing, stamping, spraying, brushing, rod-coating, spin-coating, dipping, drop-coating, or screen printing.

* * * * *